US009858009B2

(12) United States Patent
Bhalerao et al.

(10) Patent No.: US 9,858,009 B2
(45) Date of Patent: Jan. 2, 2018

(54) DATA FOLDING IN 3D NONVOLATILE MEMORY

(71) Applicant: SanDisk Technologies LLC, Plano, TX (US)

(72) Inventors: Abhijeet Bhalerao, San Jose, CA (US); Mrinal Kochar, San Jose, CA (US); Dennis S. Ea, Hayward, CA (US); Mikhail Palityka, Ontario (CA); Aaron Lee, Mountain View, CA (US); Yew Yin Ng, Milpitas, CA (US); Ivan Baran, San Jose, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 233 days.

(21) Appl. No.: 14/923,137

(22) Filed: Oct. 26, 2015

(65) Prior Publication Data
US 2017/0115884 A1 Apr. 27, 2017

(51) Int. Cl.
G06F 3/06 (2006.01)
(52) U.S. Cl.
CPC ............ *G06F 3/064* (2013.01); *G06F 3/0604* (2013.01); *G06F 3/065* (2013.01); *G06F 3/0679* (2013.01)
(58) Field of Classification Search
CPC ........ G06F 3/064; G06F 3/0604; G06F 3/065; G06F 3/0679
See application file for complete search history.

(56) References Cited

U.S. PATENT DOCUMENTS

| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,774,397 A | 6/1998 | Endoh et al. |
| 5,903,495 A | 5/1999 | Takeuchi et al. |
| 6,011,725 A | 1/2000 | Eitan |
| 6,046,935 A | 4/2000 | Takeuchi et al. |

(Continued)

FOREIGN PATENT DOCUMENTS

| EP | 2 709 110 | 3/2014 |
| WO | 2012087411 A1 | 6/2012 |

(Continued)

OTHER PUBLICATIONS

Eitan et al., "NROM: A Novel Localized Trapping, 2-But Nonvolatile Memory Cell," IEEE Electron Device Letters, vol. 21, No. 11, Nov. 2000, pp. 543-545.

(Continued)

*Primary Examiner* — Hiep Nguyen
(74) *Attorney, Agent, or Firm* — Foley & Lardner LLP

(57) ABSTRACT

Data that is initially stored in Single Level Cell (SLC) blocks is subsequently copied (folded) to a Multi Level Cell (MLC) block where the data is stored in MLC format, the data copied in a minimum unit of a fold-set, the MLC block including a plurality of separately-selectable sets of NAND strings, data of an individual fold-set copied exclusively to two or more word lines of an individual separately-selectable set of NAND strings in the MLC block.

20 Claims, 17 Drawing Sheets

(56) References Cited

U.S. PATENT DOCUMENTS

| | | | |
|---|---|---|---|
| 6,222,762 B1 | 4/2001 | Guterman et al. | |
| 6,498,851 B1 | 12/2002 | Wong | |
| 7,016,226 B2 | 3/2006 | Shibata et al. | |
| 7,057,939 B2 | 6/2006 | Li et al. | |
| 7,120,051 B2 | 10/2006 | Gorobets et al. | |
| 7,315,916 B2 | 1/2008 | Bennett et al. | |
| 7,505,320 B2 | 3/2009 | Li | |
| 7,508,721 B2 | 3/2009 | Li et al. | |
| 7,951,669 B2 | 5/2011 | Harari et al. | |
| 8,027,195 B2 | 9/2011 | Li et al. | |
| 8,094,400 B1 | 1/2012 | Han | |
| 8,144,512 B2 | 3/2012 | Huang et al. | |
| 8,214,700 B2 | 7/2012 | Chen | |
| 8,244,960 B2 | 8/2012 | Paley et al. | |
| 8,307,241 B2 | 11/2012 | Avila et al. | |
| 8,472,280 B2 | 6/2013 | Li | |
| 8,566,671 B1 | 10/2013 | Ye et al. | |
| 8,750,042 B2 | 6/2014 | Sharon et al. | |
| 8,843,693 B2 | 9/2014 | Hsu et al. | |
| 8,886,877 B1 * | 11/2014 | Avila | G06F 3/0679 711/103 |
| 8,902,652 B1 * | 12/2014 | Huang | G11C 11/5628 365/185.03 |
| 8,972,675 B2 * | 3/2015 | Avila | G06F 12/0246 711/111 |
| 9,043,537 B1 | 5/2015 | Gorobets et al. | |
| 9,058,881 B1 | 6/2015 | Dusija et al. | |
| 9,098,205 B2 | 8/2015 | Avila et al. | |
| 9,195,587 B2 * | 11/2015 | Kochar | G06F 12/0246 |
| 9,235,470 B2 * | 1/2016 | Bhalerao | G06F 11/1068 |
| 9,400,747 B2 * | 7/2016 | Tuers | G06F 12/0246 |
| 9,558,847 B2 * | 1/2017 | Tuers | G11C 29/38 |
| 9,575,683 B2 * | 2/2017 | Achtenberg | G06F 11/1012 |
| 9,583,207 B2 * | 2/2017 | Khurana | G11C 16/349 |
| 9,678,832 B2 * | 6/2017 | Tuers | G06F 11/1068 |
| 2007/0109858 A1 | 5/2007 | Conley et al. | |
| 2008/0316815 A1 | 12/2008 | Lin | |
| 2010/0174847 A1 | 7/2010 | Paley et al. | |
| 2010/0318721 A1 | 12/2010 | Avila et al. | |
| 2010/0318839 A1 | 12/2010 | Avila et al. | |
| 2011/0072332 A1 | 3/2011 | Tomlin | |
| 2011/0096601 A1 | 4/2011 | Gavens et al. | |
| 2011/0099418 A1 | 4/2011 | Chen | |
| 2011/0099460 A1 | 4/2011 | Dusija et al. | |
| 2011/0149650 A1 | 6/2011 | Huang et al. | |
| 2011/0153912 A1 | 6/2011 | Gorobets et al. | |
| 2011/0267885 A1 | 11/2011 | Kato | |
| 2012/0001247 A1 | 1/2012 | Alsmeier | |
| 2012/0182803 A1 | 7/2012 | Shirakawa | |
| 2012/0256247 A1 | 10/2012 | Alsmeier | |
| 2012/0272120 A1 | 10/2012 | Chen | |
| 2012/0287710 A1 | 11/2012 | Shirakawa | |
| 2012/0297122 A1 | 11/2012 | Gorobets et al. | |
| 2012/0311244 A1 | 12/2012 | Huang et al. | |
| 2013/0024605 A1 | 1/2013 | Sharon et al. | |
| 2013/0028021 A1 | 1/2013 | Sharon et al. | |
| 2013/0031429 A1 | 1/2013 | Sharon et al. | |
| 2013/0031430 A1 | 1/2013 | Sharon | |
| 2013/0031431 A1 | 1/2013 | Sharon et al. | |
| 2013/0107628 A1 | 5/2013 | Dong et al. | |
| 2013/0155769 A1 | 6/2013 | Li et al. | |
| 2014/0254263 A1 | 9/2014 | Avila et al. | |
| 2015/0006784 A1 | 1/2015 | Avila et al. | |
| 2015/0012684 A1 | 1/2015 | Avila et al. | |
| 2015/0012685 A1 | 1/2015 | Avila et al. | |
| 2015/0154108 A1 | 6/2015 | Gorobets et al. | |
| 2015/0160857 A1 | 6/2015 | Gorobets et al. | |
| 2015/0160893 A1 * | 6/2015 | Gorobets | G06F 3/061 711/103 |

FOREIGN PATENT DOCUMENTS

| | | |
|---|---|---|
| WO | 2012158521 A1 | 11/2012 |
| WO | 2012174216 A2 | 12/2012 |

OTHER PUBLICATIONS

International Search Report issued on PCT/US2016/051256, dated Dec. 15, 2016.

* cited by examiner

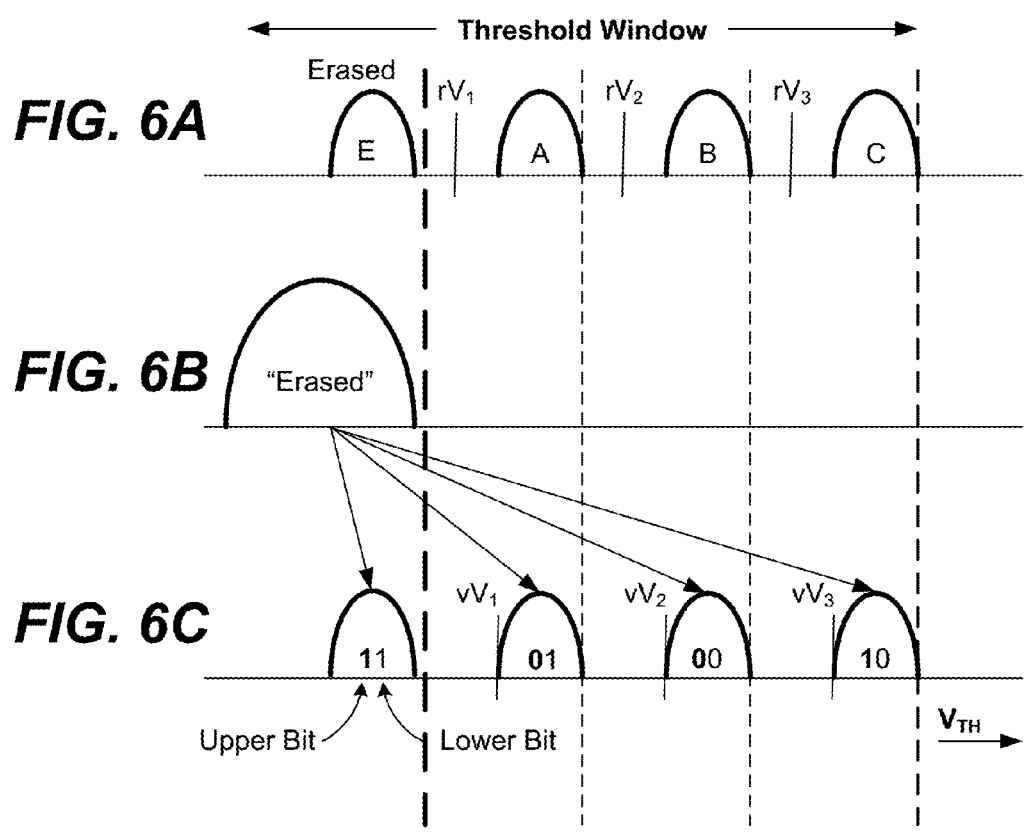
Programming into four states represented by a 2-bit code

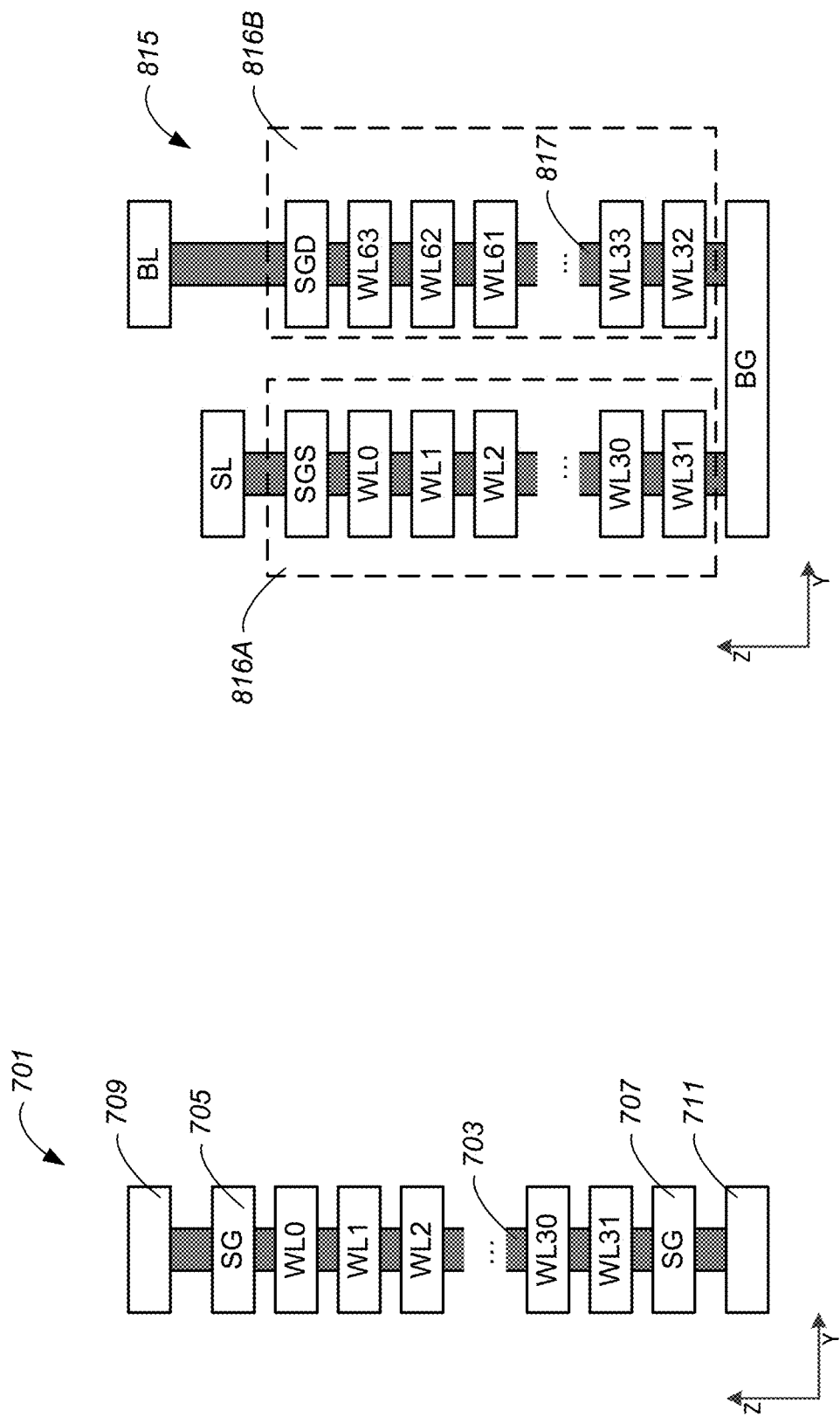

SLC Block 131

| WL-SLC | Offset in Foldset |
|---|---|
| 0 | 0 |
| 1 | 1 |
| 2 | 2 |
| 3 | 3 |
| 4 | 4 |
| 5 | 5 |
| 6 | 6 |
| 7 | 7 |
| 8 | 0 |
| 9 | 1 |
| 10 | 2 |
| 11 | 3 |
| 12 | 4 |
| 13 | 5 |
| 14 | 6 |
| 15 | 7 |
| 16 | 0 |
| 17 | 1 |
| 18 | 2 |
| 19 | 3 |
| 20 | 4 |
| 21 | 5 |
| 22 | 6 |
| 23 | 7 |

A: rows 0–7
B: rows 8–15
C: rows 16–23

MLC Block 133

| WL-MLC | Page | Offset in Foldset (From SLC blocks) |
|---|---|---|
| 0 | U | 2 |
|  | M | 1 |
|  | L | 0 |
| 1 | U | 5 |
|  | M | 4 |
|  | L | 3 |
| 2 | U | 0 |
|  | M | 7 |
|  | L | 6 |
| 3 | U | 3 |
|  | M | 2 |
|  | L | 1 |
| 4 | U | 6 |
|  | M | 5 |
|  | L | 4 |
| 5 | U | 1 |
|  | M | 0 |
|  | L | 7 |
| 6 | U | 4 |
|  | M | 3 |
|  | L | 2 |
| 7 | U | 7 |
|  | M | 6 |
|  | L | 5 |

DATA FOLDING IN 3D NONVOLATILE MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit may be localized in the dielectric layer adjacent to the drain, and the charge for the other data bit may be localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

In a nonvolatile memory, such as a three dimensional NAND flash memory, data may be rapidly written in Single Level Cell (SLC) format when it is received. Subsequently, the data may be copied or folded into Multi Level Cell (MLC) blocks where data is stored with higher density than SLC (more than one bit per cell, e.g. two, three, or more bits per cell). Folding may be performed on a minimum unit of a fold-set that includes data from multiple sequential physical pages in SLC and which extends over multiple word lines when copied to MLC (e.g. eight logical pages that extend over three word lines in 3-bit-per-cell MLC). In a three dimensional NAND flash memory block that includes separately-selectable sets of NAND strings, a fold-set may be copied so that all data of a fold-set is stored in a single separately-selectable set of NAND strings. Thus, if a set of strings is bad, the affected fold-sets are entirely in the bad set of strings and the number of affected fold-sets is relatively small. Data may be scrambled (randomized) during folding so that the data is scrambled when it is written in the MLC block. Scrambling may use a repetitive pattern with each fold-set corresponding to an iteration of the repetitive pattern (e.g. one cycle of a cyclic pattern of keys or offsets).

An example of a method of managing data in a three dimensional nonvolatile NAND memory includes: copying first data of a first fold-set from a Single Level Cell (SLC) portion of the three dimensional nonvolatile NAND memory where the first data is stored in SLC format to a Multi Level Cell (MLC) block where the first data is stored in MLC format along two or more word lines in a first separately-selectable set of NAND strings of the MLC block, a fold-set being a minimum unit of data folding; and copying second data of a second fold-set from the SLC portion where the second data is stored in SLC format to the MLC block where the second data is stored in MLC format along two or more word lines in a second separately-selectable set of NAND strings of the MLC block.

The first and second data may be scrambled prior to storage in the MLC block, and a fold-set may be a minimum unit of data scrambling. Data in the SLC portion may be copied in fold-sets so that each fold-set is copied to an individual separately-selectable set of NAND strings of the MLC block and no fold-set extends across more than one separately-selectable set of NAND strings of the MLC block. A fold-set may consist of eight logical pages of data, the first data consisting of data from eight sequential word lines of the SLC portion, the second data consisting of data from another eight sequential word lines of the SLC portion. The data of a fold-set may be scrambled using a different offset scrambling key for each of the eight logical pages of data. Third data may be copied from the SLC portion where the third data is stored in SLC format to the MLC block where the third data is stored in MLC format along two or more word lines in a third separately-selectable set of NAND strings of the MLC block; and fourth data may be copied from the SLC portion where the fourth data is stored in SLC format to an MLC block where the fourth data is stored in MLC format along two or more word lines in a fourth separately-selectable set of NAND strings of the MLC block.

The MLC block may consist of n separately-selectable sets of NAND strings, where n is greater than two, and no two separately-selectable sets of NAND strings may contain data copied from the same fold-set. A separately-selectable set of NAND strings may be identified as defective, and subsequently no data may be stored in the separately-selectable set of NAND strings that is identified as defective. Copying the first data to the MLC block may be interleaved with copying the second data to the MLC block.

A system may include: a three-dimensional nonvolatile memory array that includes a plurality of Single Level Cell (SLC) blocks in an SLC portion where a memory cell stores one bit and a plurality of Multi Level Cell (MLC) blocks where a memory cell stores more than one bit; and a data folding unit configured to copy a first fold-set from the SLC portion to a first separately-selectable set of NAND strings in an MLC block, and to copy a second fold-set from the SLC portion to a second separately-selectable set of NAND strings in the MLC block, the data folding unit configured to fold data in a minimum unit of a fold-set.

A data scrambling unit may scramble data prior to storage in the MLC block, the data scrambling unit configured to scramble data in fold-sets, a fold-set being a minimum unit of data folding and scrambling. The MLC block may contain n separately-selectable sets of NAND strings, the data folding unit configured to copy data from n SLC blocks to the n separately-selectable sets of NAND strings, data from an individual SLC block copied to an individual separately-selectable set of NAND strings. The data folding unit may be configured to interleave copying of first data to the MLC block and copying of second data to the MLC block. A bad string record may be used to record locations of bad separately-selectable sets of NAND strings in the three dimensional nonvolatile memory array, and the data folding unit may be configured to copy no data to any bad separately-selectable set of NAND strings. A bad string identification unit may identify separately-selectable sets of NAND strings that do not meet a predetermined standard.

An example of a method of operating a three dimensional nonvolatile NAND memory includes: storing data in a plurality of Single Level Cell (SLC) blocks where the data is stored in SLC format; and subsequently copying the data to a Multi Level Cell (MLC) block where the data is stored in MLC format, the data copied in a minimum unit of a fold-set, the MLC block including a plurality of separately-selectable sets of NAND strings, data of an individual fold-set copied exclusively to two or more word lines of an individual separately-selectable set of NAND strings in the MLC block.

Copying the data to the MLC block may interleave copying of data of a plurality of fold-sets. The data may be scrambled prior to storage in the MLC block according to a scrambling scheme. A fold-set may consist of data from X word lines in an individual SLC block and the scrambling scheme may apply a repetitive pattern that repeats every X word lines. A bad separately-selectable set of NAND strings in the MLC block may be detected and in response data of corresponding fold-sets may be left in the plurality of SLC blocks.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIGS. 11A-B illustrate an example of folding three fold-sets.

DETAILED DESCRIPTION

Memory System

Figure 1:
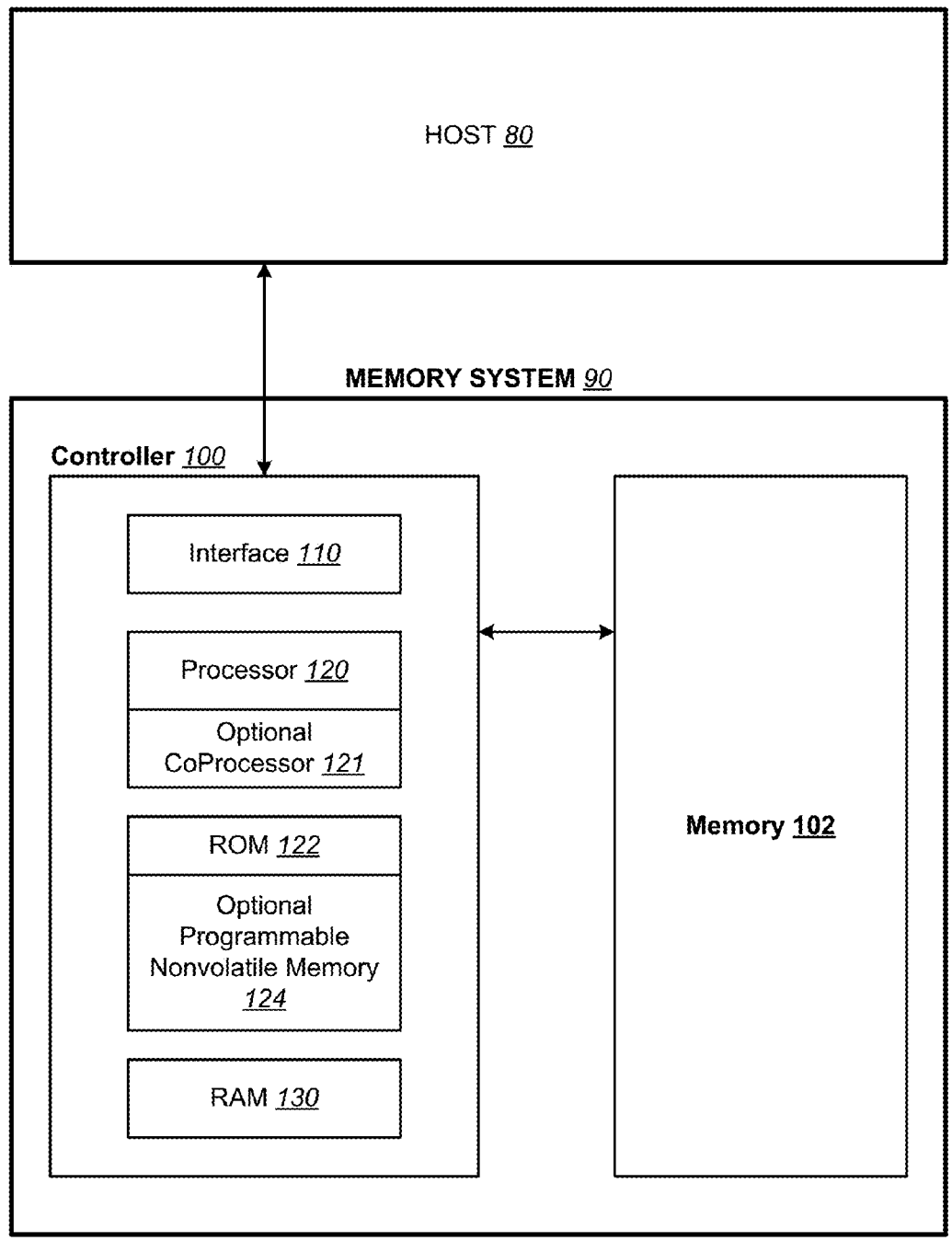
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
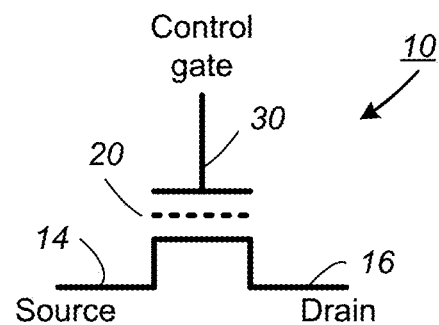
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
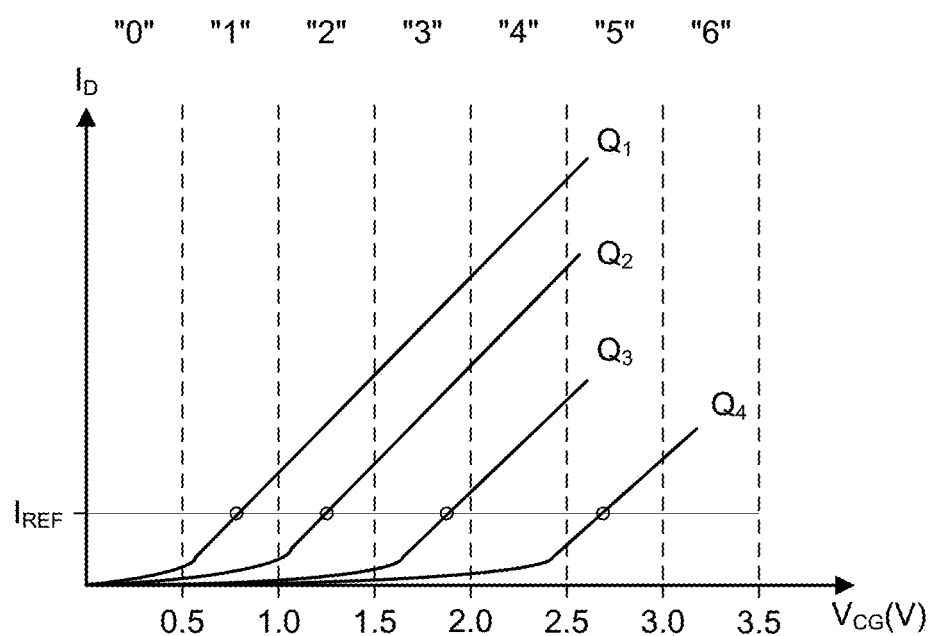
FIG. 3 illustrates the relation between the source-drain current $I_D$ and the control gate voltage $V_{CG}$ for four different charges Q1-Q4 that a floating gate may store.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, TREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
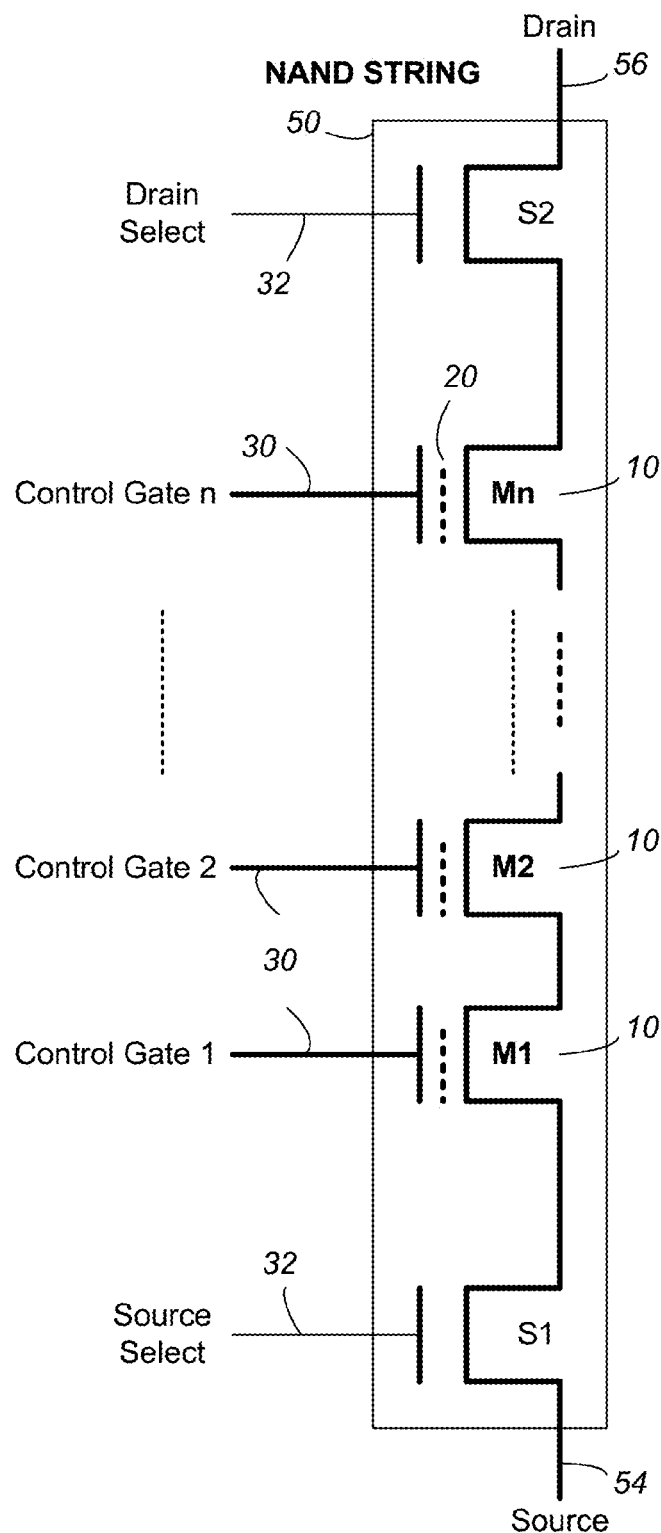
FIG. 4A illustrates schematically a string of memory cells organized into a NAND string.

FIG. 4A illustrates schematically a string of memory cells organized into a NAND string. A NAND string 50 comprises a series of memory transistors M1, M2, Mn . . . (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
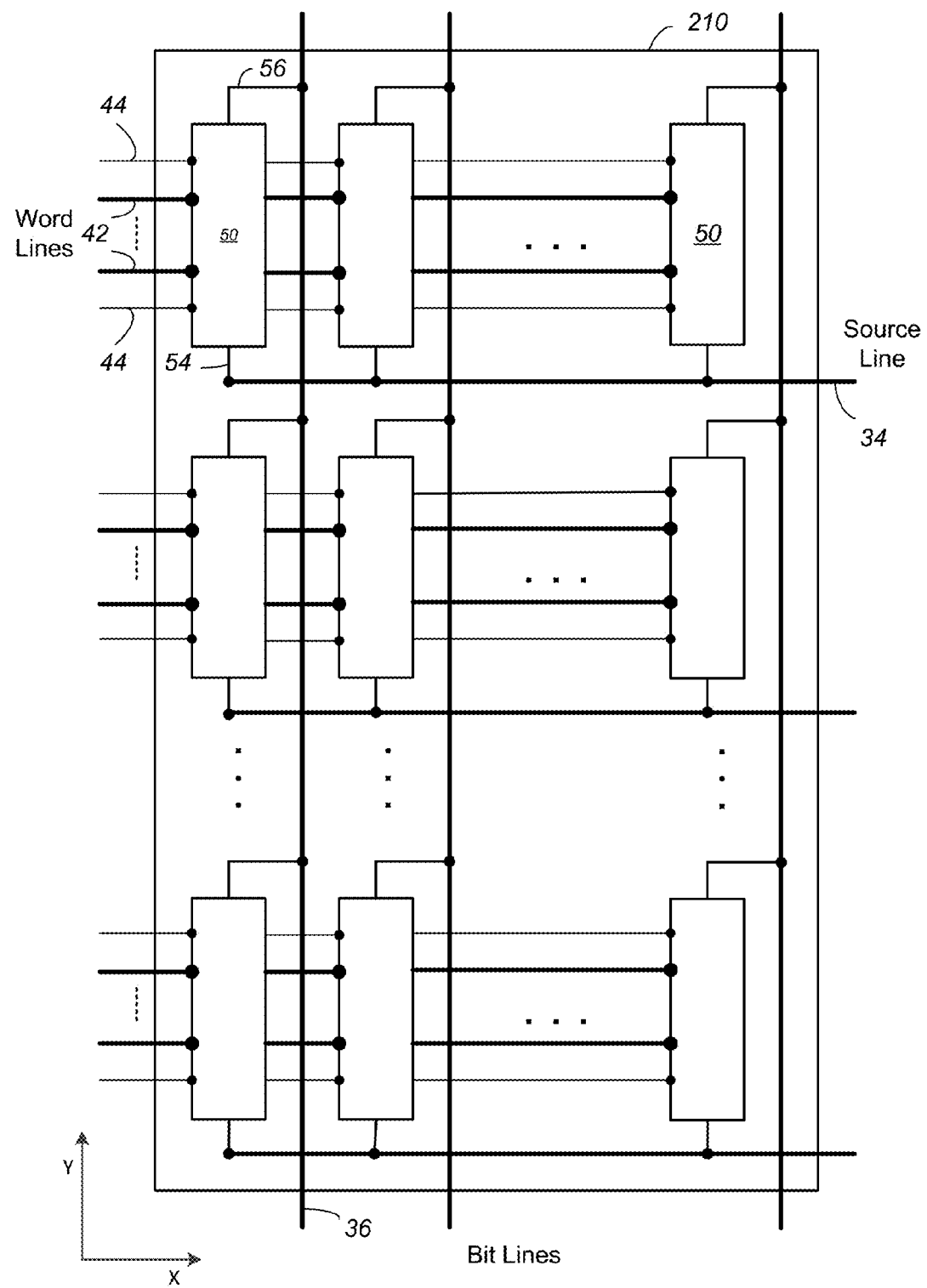
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
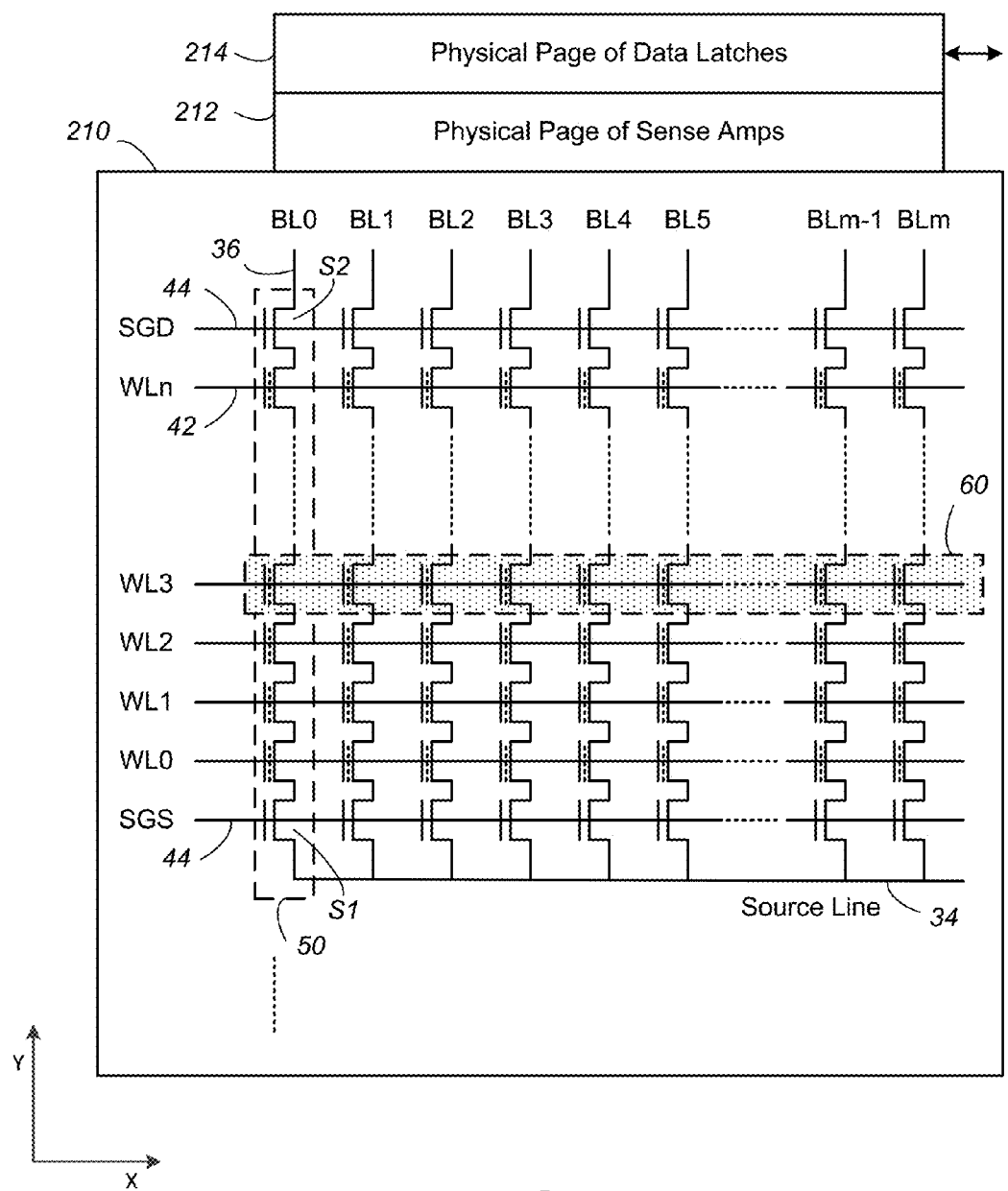
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
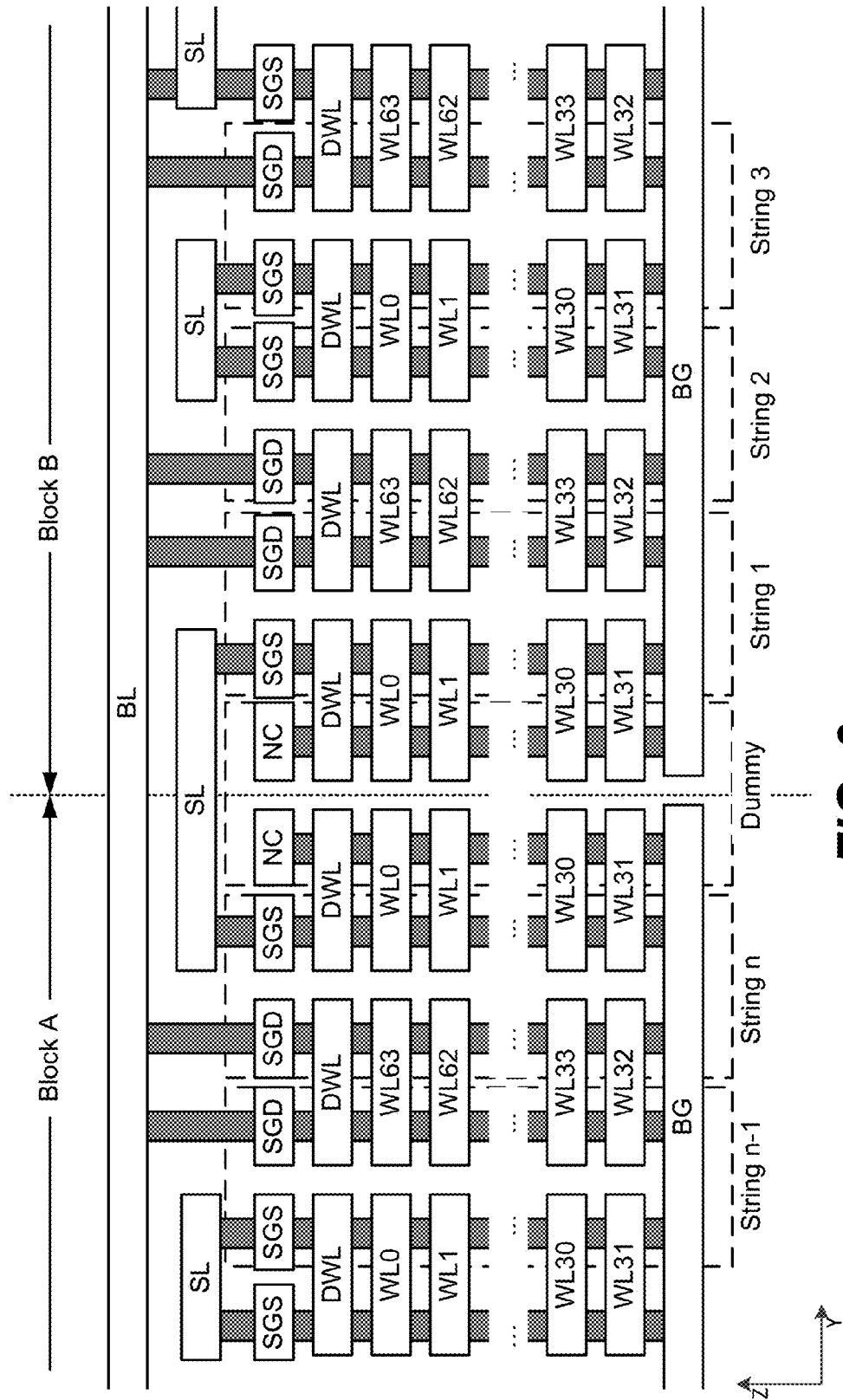
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n separately-selectable sets of strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10A:
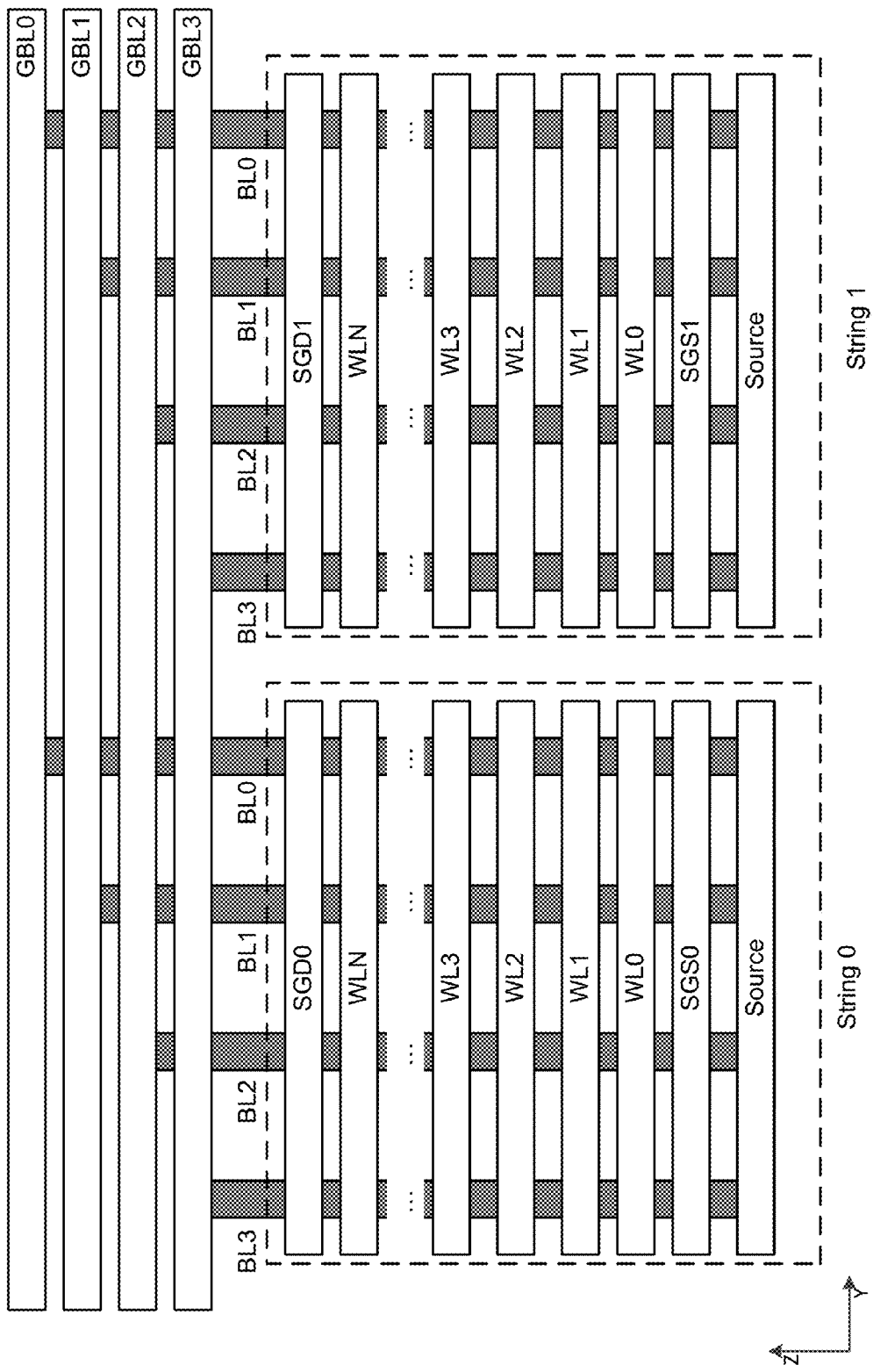
FIGS. 10A-C illustrate an example of a 3-D NAND memory with multiple separately-selectable sets of strings in a block.

FIG. 10A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 10A shows only portions of GBL0-GBL3, and that these bit lines extend further in the y-direction and may connect with additional NAND strings in the block and in other blocks. Furthermore, additional bit lines extend parallel to GBL0-GBL3 (e.g. at different locations along x-axis, in front of, or behind the location of the cross-section of FIG. 10A).

Figure 10B:
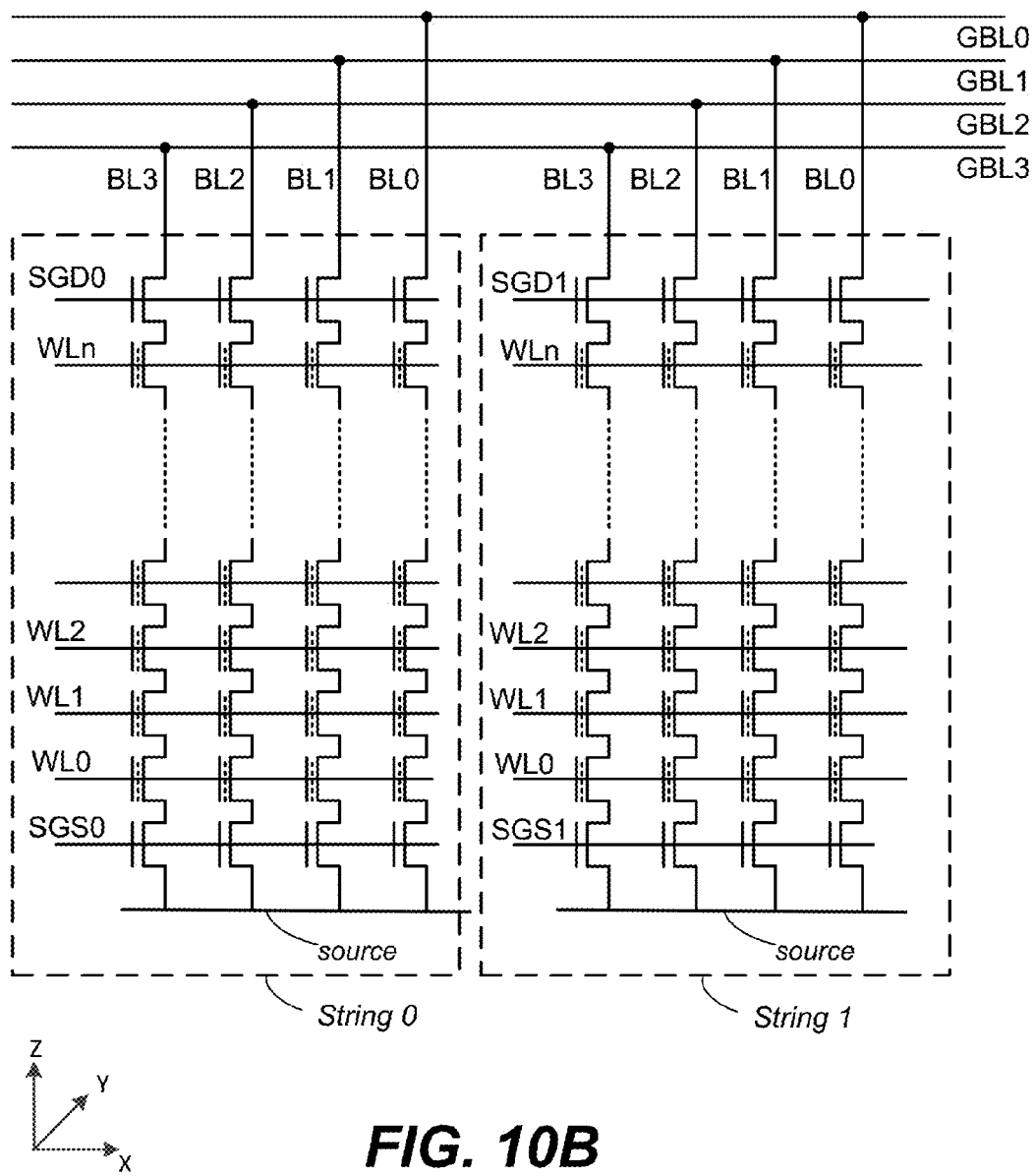

FIG. 10B illustrates separately-selectable sets of NAND strings of FIG. 10A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 10C:
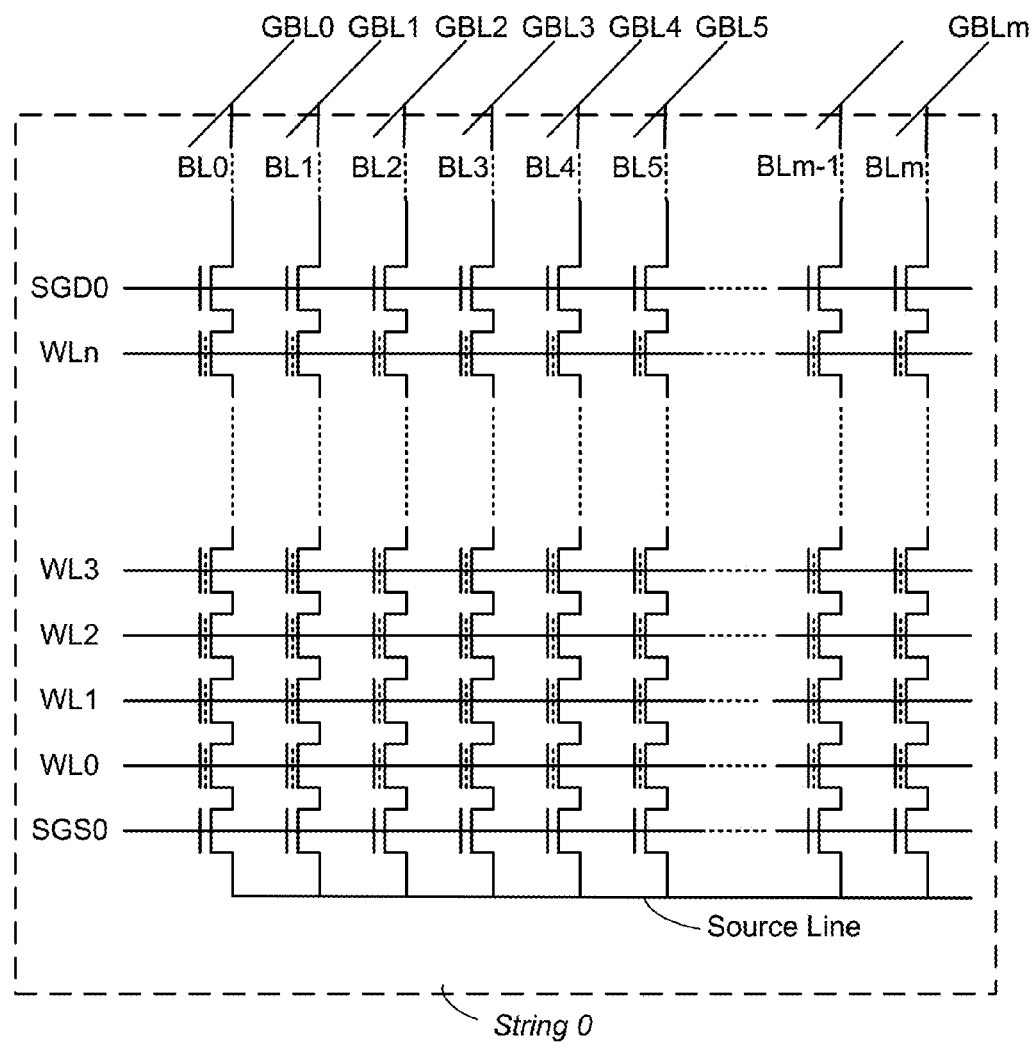

FIG. 10C shows a separately selectable set of NAND strings, String 0, of FIGS. 10A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Data Folding

In some memory systems, data is stored in both SLC and MLC formats. For example, some blocks may operate as SLC blocks that store one bit per cell while other blocks operate as MLC blocks that store more than one bit per cell (e.g. two, three, or more bits per cell). Physical blocks may be reconfigured as needed so that a physical block may be operated as an SLC block at one time and may be operated as an MLC block at another time.

In general, writing data in SLC format is faster than writing data in MLC format because of the higher resolution required for MLC writes. MLC format stores more data per block than SLC format and thus provides greater data storage capacity. In order to take advantage of the higher write speed of SLC and the higher storage density of MLC, a memory system may initially write data in SLC format in SLC blocks and subsequently copy the data to MLC blocks. Copying data in this way may be referred to as "folding" data (folding data from multiple SLC pages into an MLC page) and may be performed as a background operation so that write performance is not affected.

Data folding may be performed in data units that correspond to multiple word lines of an MLC block. A minimum unit of data folding may be referred to as a "fold-set." A decision may be made on a fold-set by fold-set basis as to whether folding should be performed, and whether folding is successful. Thus, if one page of a fold-set is not readable from MLC then the entire fold-set is considered to have failed to fold even if other pages are readable. If folding is not successful then the data of the fold-set may remain in SLC and this determination is made on a fold-set by fold-set basis and is recorded on a fold-set by fold-set basis.

FIG. 11A shows an example of three fold-sets, A-C, in an SLC block 131. Each fold-set consists of eight logical pages that are stored in eight sequential word lines (e.g. fold-set A is stored in WL 0-7). Logical pages are identified by offsets from the start of their respective fold-sets so that offsets repeat in each fold-set.

FIG. 11B shows an MLC block 133 (e.g. a block in planar NAND memory) after fold-sets A-C have been copied from SLC block 131 to MLC block 133. Pages are copied sequentially in this example beginning by copying from word line (WL) 0 of SLC block 131 to the lower (L) page of word line 0, then copying from word line 1 of SLC block 131 to the middle (M) page of word line 0, then copying from word line 2 of SLC block 133 to the upper (U) page of word line 0. Subsequently, data is copied from word lines 3-23 of SLC block 131 to word lines 1-7 of MLC block in the order shown.

If an individual word line in MLC block 133 is bad (e.g. if it fails program-verify or otherwise fails to meet a predetermined standard), then data stored along that word line is generally not usable. For example, if word line 2 of MLC block is bad, then data stored along word line 2 (lower, middle, and upper logical pages) may not be usable. Because a fold-set is a minimum unit of folding, folding of any fold-set containing data stored along such a bad word line may be considered to have failed. Thus, folding of fold-set A and fold-set B may be considered to have failed. Accordingly, data of fold-sets A and B may be maintained in SLC block and their locations in SLC block 131 may be recorded.

Figures 12A, 12B, 13:
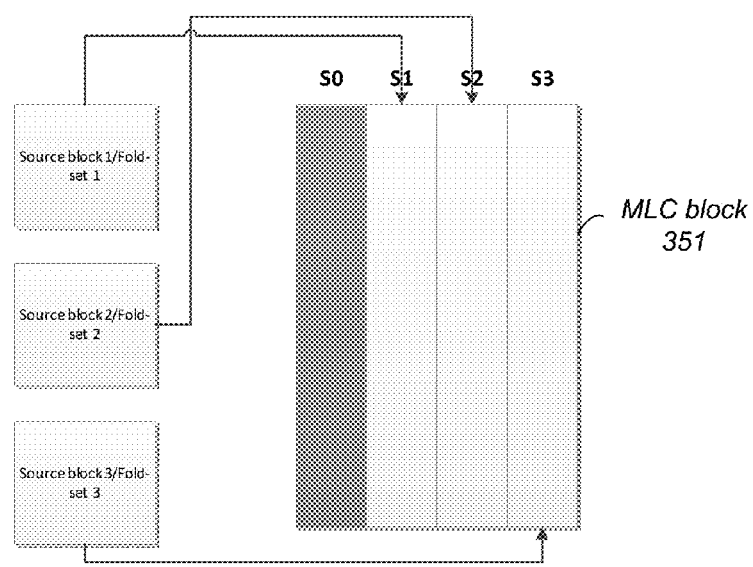
FIGS. 12A-B illustrates an example of data folding with fold-sets extending across multiple sets of strings in a block.
FIG. 13 illustrates an example of folding fold-sets to individual sets of strings.

FIGS. 12A-B illustrate an example of data folding in a three dimensional nonvolatile memory in which each block has four separately-selectable sets of strings S0-S3. FIG. 12A illustrates how eight-page fold-sets are stored in SLC block 241. Each fold-set occupies two word lines in each of the separately-selectable sets of strings (e.g. word lines 0-1 in each of S0-S3).

FIG. 12B illustrates an example of how the fold-sets of FIG. 12A may be folded into MLC block 243. Fold sets are written along word line 0 of all sets of strings of MLC block first, then word line 1 of all sets of strings, then word line 2 of all sets of strings, and so on. Thus, logical pages of the first fold-set with offsets 0, 1, and 2, respectively are copied to lower, middle, and upper pages of WL0 in S0. Then, logical pages of the first fold-set with offsets 3-5 are folded to word line 0 of S1, and so on.

It can be seen that this folding arrangement leaves fold-sets extending across multiple separately-selectable sets of strings. For example, the first fold-set (from WL 0-1 of SLC block 241) extends across S0, S1, and S2, the next fold set (from WL 2-3 of SLC block 241) extends across all sets of strings, S0-S3, of MLC block 243. Certain failure modes may affect a single separately-selectable set of strings. For example, a defect that affects select lines may make one or more separately-selectable set of NAND strings in a block defective while other separately-selectable sets of NAND strings in the block remain usable. When data is folded as shown in FIG. 12B, a bad set of strings may affect data of a large number of fold-sets. For example, if S0 or S3 is bad, then two thirds of the fold-sets are affected. If S1 or S2 is bad, then all fold-sets are affected. It will be understood that the number of fold-sets affected by a bad separately-selectable set of strings depends on the number of such sets of strings per block and on the size of a fold-set. When copying of a fold-set to MLC fails, the fold-set may be maintained in SLC memory and subsequent access operations (e.g. host reads) may be directed to the SLC copy. Thus, a large number of affected fold-sets may result in a large amount of data remaining in SLC where it occupies a larger area than it would in MLC. In contrast, when folding of a fold-set to MLC is successful, the SLC copy may be discarded (marked as obsolete and subsequently erased) and subsequent access operations may be directed to the MLC copy where the data occupies a smaller area.

According to an example, fold-sets may be copied from SLC to MLC so that any given fold-set is stored along two or more word lines of a single separately-selectable set of NAND strings and does not extend across two or more sets of strings. Instead of extending a fold-set across multiple separately-selectable sets of strings as in FIG. 12B, a fold-set extends down multiple word lines of the same separately-selectable set of strings in an MLC block. This results in fewer fold-sets being affected by any bad sets of strings.

FIG. 13 illustrates an example of a data folding scheme in which three fold-sets (fold-sets 1-3) are copied from three different SLC source blocks (source blocks 1-3) to three different separately-selectable sets of NAND strings S1-S3 in a destination MLC block 351. Thus, each fold-set is contained within a single separately-selectable set of NAND strings. One separately-selectable set of NAND strings, S0 (shaded), is defective in this example and so no data is copied to S0. In other examples, data may be copied to a defective area before the portion is identified as defective. Such data may be maintained in SLC and any subsequent access may be directed to the SLC copy so that the defective set if strings is not used. Data in S1-S3 is unaffected by S0 being defective because there is no data in S1-S3 from any fold-set that includes data stored in S0. While FIG. 13 shows an example of one-to-one mapping from SLC blocks to separately-selectable sets of strings in an MLC block, other examples may have other mappings that allow an individual fold-set to be stored within a single separately-selectable set of strings in the MLC block.

Figure 14:
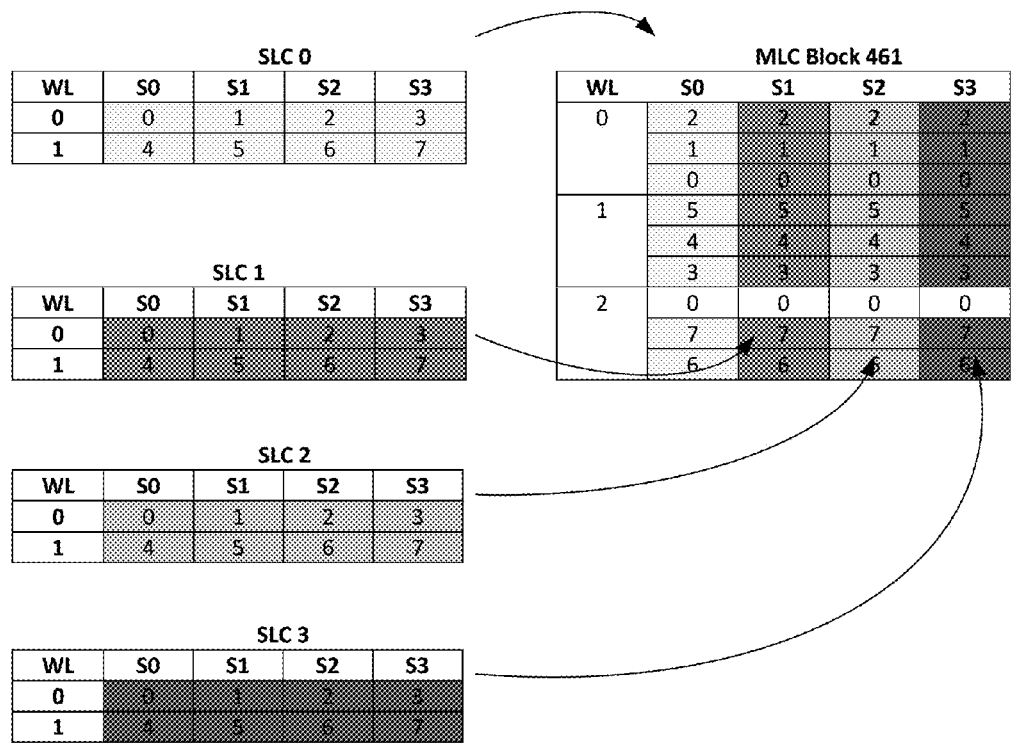
FIG. 14 shows another example of folding fold-sets to individual sets of strings.

FIG. 14 illustrates an example of copying data of four fold-sets from four SLC blocks (SLC 0-3) to an MLC block 461. Fold-set 0 from SLC 0 is copied to S0, fold-set 1 from SLC 1 is copied to S1, fold-set 2 from SLC 2 is copied to S2, and fold-set 3 from SLC 3 is copied to S3. Pages are copied as indicated by page offset numbers so that fold-set 0 is copied to lower, middle, and upper pages (indicated by relative positions) of word lines 0 and 1 of S0 the MLC block and to lower and middle pages of word line 2 of S0. The upper page of word line 2 of S0 in MLC block 461 then receives a page of data of another fold-set (starting with offset 0). Fold-sets 1-3 are similarly copied to S1-S3 respectively. Thus, each fold-set is contained exclusively within a corresponding separately-selectable set of NAND strings (no fold-set extends across two or more such separately-selectable sets of NAND strings). If any set of strings fails then only the fold-sets that are mapped to that set of strings are affected. Such fold-sets may be maintained in the SLC portion and may subsequently be accessed from SLC so that even if the data is written in a bad string, the data is not subsequently read from the bad string. If the bad string is detected prior to copying data to the bad string then the copying may not be performed and the data may simply remain in the SLC portion.

Data may be copied in any suitable order. In one example, copying of data of different fold-sets is interleaved so that writing is directed to a given word line of all sets of strings and then proceeds to the next word line. For example, WL 0 of S0 may be written (lower, middle, and upper pages) followed by WL0 of S1, then WL0 of S3. Then, with all memory cells of WL0 fully written (i.e. three bits per cell), a write operation proceeds to the next word line in MLC block 461. SLC source blocks SLC 0-3 may be formed on the same die, and may be in the same plane as the destination MLC block 461. In this way, copying may be carried out efficiently without sending data outside the die or plane. For example, on chip latches may be used to latch data that is being copied. A memory bus between memory dies may not be used during such on-chip copying so that such a memory bus remains available for other data traffic.

Figure 15:
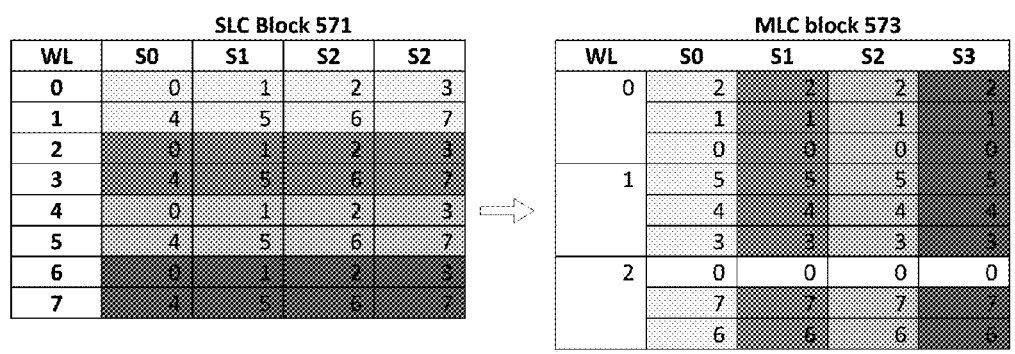
FIG. 15 shows folding fold-sets from the same SLC block to an MLC block.

FIG. 15 illustrates an example in which fold-sets (indicated by different shading) are copied from an SLC block 571 to different separately-selectable sets of strings in an MLC block 573 so that no fold-set extends across multiple separately-selectable sets of NAND strings in MLC block 573 (i.e. each fold-set is contained in a corresponding set of strings). While the previous example showed fold-sets being copied from multiple SLC blocks so that a fold-set from a given block was mapped to a corresponding set of strings, in this example, the fold-sets shown come from the same SLC block 571 and are copied to different sets of strings in MLC block 573. It will be understood that additional data from other SLC blocks may be copied to other word lines of MLC block 573.

Data Scrambling

Data that is stored using charge storage (or other form of nonvolatile memory) may be randomized or scrambled in some way for a number of reasons (the terms "randomize" and "scramble" may be considered synonymous for purposes of the present application, similarly "randomizer" and "scrambler" may be considered synonymous). For example, data randomization may be used as a way to avoid particular patterns of programming memory cells that could lead to an increased risk of data disturbance. It has been found that certain patterns, such as groups of cells programmed with higher charge (in a charge storage memory) may affect threshold voltages of adjacent cells and thus cause data to be misread. Scrambling data tends to break up any such patterns that may be present in data to be stored. Data stored in MLC format may be more susceptible to problems related to data patterns. Therefore, data may be scrambled as part of a folding operation. Data may initially be stored in SLC without scrambling (thus maintaining a high write speed) and may later be scrambled when it is folded to MLC.

Figure 16A:
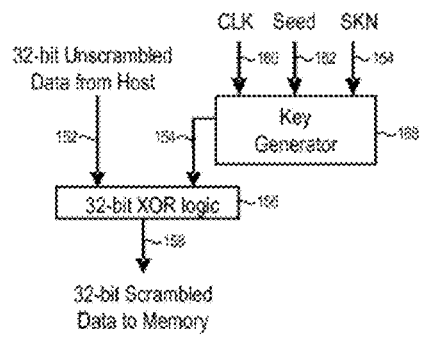
FIGS. 16A-B illustrate a scrambler and descrambler respectively.
Figure 16B:
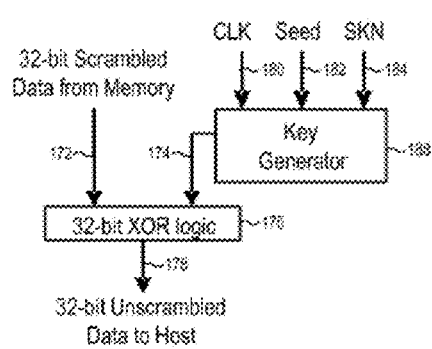
Figure 17:
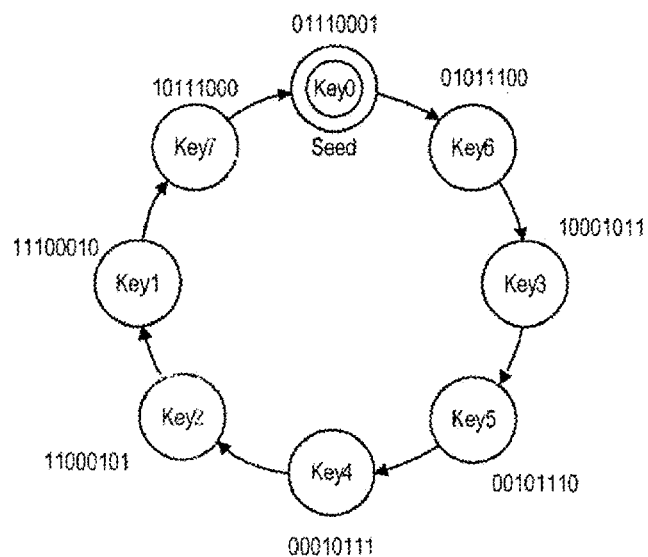
FIG. 17 illustrates an example of a sequence of keys for data scrambling.

FIGS. 16A-B and 17 illustrate rotating keys that may be used in a scrambler to scramble data prior to storage in a nonvolatile memory. Such scrambling may be based on a simple encryption method using exclusive-OR (XOR) logic and a known key. The simple XOR logic provides for scrambling data using the key, and then descrambling to get the original data back using the same key. In FIG. 16A, unscrambled data from a host is conveyed on bus 152 to an XOR block 156. In addition, a scrambling key is conveyed on bus 154 to the XOR block 156, which then performs a bit-wise XOR operation to generate the scrambled data conveyed on bus 158. The key generator 168 receives a clock signal 160, a seed key on bus 162, and a starting key number SKN on bus 164 (explained below), from which it generates the scrambling key on bus 154.

In FIG. 16B, scrambled data from a memory is conveyed on bus 172 to an XOR block 176. The scrambling key is conveyed on bus 174 to the XOR block 176, which then performs a bit-wise XOR operation to generate the unscrambled data conveyed on bus 178. As before, the key generator 188 receives a clock signal 180, a seed key on bus 182, and a starting key number SKN on bus 184, from which it generates the descrambling key on bus 174. Even though shown as separate blocks, the XOR block and Key generator block may be shared and used for both scrambling and descrambling, with appropriate steering of the various input and output busses. Bit-wise XOR operation between Host data and Scrambler Keys enables simple descrambling with the known Seed and Key number used to scramble.

A set of bit strings can be easily generated by rotating an initial bit string, referred to as the Seed, one bit at a time until the pattern of bits starts repeating. This can be accomplished by employing a fixed length shift register to create a sequence of rotating Keys with the Key values being controlled by the initial Seed value. For example, an 8-bit shift register can produce up to 8 unique Keys. An exemplary set of rotating 8-bit keys are shown in FIG. 17. Of course, an initial bit string alternatively could be rotated in the opposite direction to generate a sequence of rotating keys. In some embodiments, a serial shifter may be used, while in other embodiments other shifters, such as a barrel shifter, may be used.

Thus, in certain embodiments, the Scrambler Keys may be generated from an initial Seed Key which may be rotated one bit at a time to create successive Scrambler Keys. The Seed may be 32 bits long (although any other length may also be used), and may have a predetermined hardware default value, which firmware (FW) may change during initialization. Every 32 bits of data are XOR'ed with a Scrambler Key, after which the next Key is automatically generated (e.g., by left-rotating the current Key to create the next Key) to be used with the next 32 bits of data.

The Keys are logically XOR'ed with chunks of data (e.g., 32 bits of data), thus the number of 1's and 0's in the Keys causes data bits to toggle, which directly translates to memory cell states being scrambled across the word-lines. After 128 bytes (32 Keys*32 bits/8 bits/byte) from the beginning of the memory page, the key number will wrap around and the scrambling pattern will repeat itself. Since the purpose of the Scrambler is to avoid fixed patterns rather than to encrypt the data, re-using the keys after 128 bytes may be sufficient "randomness" to break up memory cell states across a word line (i.e., from bit line to bit line). However, other randomization techniques may be employed, as noted below, that may be even more "random."

To break up memory cell states of different logical pages of a word line and going down NAND strings, i.e. going from word line to word line in a three dimensional NAND memory array, each logical page in a physical page starts using a different key in a pattern that repeats every fold-set.

The identification of the first key to be used for each page may be provided by a Starting Key Number (SKN), which acts as an index or offset from a fixed reference point (i.e., Key0 or the Seed). The index is changed on every logical page transition to create a staggered bit pattern produced from the bit strings of the rotating Keys. Such a logical page address transition occurs when transitioning from one word line to the next word line, and may also occur within a single word line (e.g., in an MLC cell having an upper page, a middle page, and a lower page stored in the memory cells of a given word line). The ability to offset the starting Key results in a bitmap-like pattern of walking 0's and 1's that when XOR'ed with the data, produces a striping effect across the memory cell array. Thus, the Scrambler Keys serve the purpose of toggling bits. The rotation of the Keys serves to shift the bit patterns across the word lines (and across different pages). The Starting Key Number serves the purpose of shifting the bit patterns going down the bit-lines, while setting the correct Key according to the appropriate page.

Rotating keys along word lines and from word line to word line as described above may avoid certain problematic patterns of data in two dimensional or three dimensional memory arrays. In some cases, a unit of data scrambling is the same size as a unit of data folding so that individual logical pages within a fold-set are each scrambled differently (e.g. using different key offset) in a predetermined pattern. Offsets within different fold-sets may be the same so that, for example, a logical page with offset 0 in a given fold-set is scrambled with the same key offset as a logical page with offset 0 in any other fold-set. Thus, there is no need to store keys with the data. In order to descramble data, the correct key may be obtained from the offset of the data within a fold-set. While the examples above show eight logical pages in a fold-set, and a corresponding set of eight keys used for scrambling logical pages of a fold-set, fold-sets may be of any suitable size. In general, smaller fold-sets may require more overhead to manage while larger fold-sets may result in greater fragmentation of data.

Figure 18:
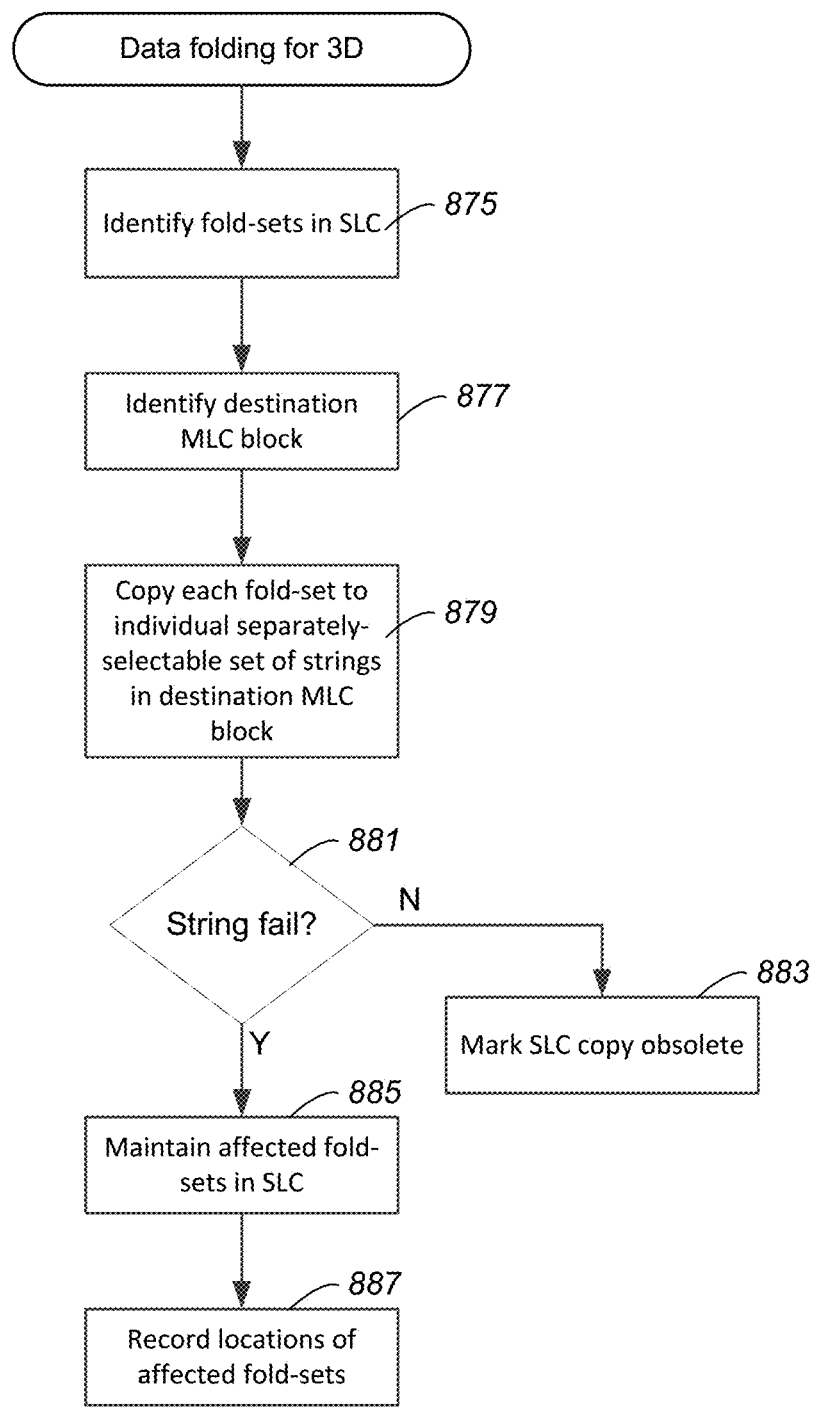
FIG. 18 illustrates an example of data folding scheme for three dimensional memory.

FIG. 18 illustrates an example of a data folding scheme that is suitable for three dimensional memories. Folding may be performed as a background operation so that memory performance is not affected. Folding may be performed on-chip in some cases so that data being folded is copied from one portion of a memory die to another portion of the die without being sent off-chip, thus providing faster copying without using a memory bus or other external components. A number of fold-sets are identified 875 in an SLC portion of a three dimensional memory array. The source fold-sets may be in a single SLC block or may be from different SLC blocks (in the same plane, die, or distributed across multiple planes or dies). A destination MLC block is identified 877. Each fold-set from the SLC portion is copied 879 to an individual separately-selectable set of strings in the MLC block. For example, fold-set 0 to string 0, fold-set 1 to string 1, and so on. Thus, data of a given fold-set is contained in one and only one separately-selectable set of NAND strings. If folding of data to all sets of strings in the MLC block is successful 881 then folding ends and the SLC copies may be marked obsolete 883. If folding data to a particular separately-selectable set of NAND strings in the MLC block fails 881 then the affected fold-sets are maintained in the SLC portion 885. Entries are created in a record for each affected fold-set 887. The record provides a map that indicates physical locations where uncopied data is to be found so that subsequent access is directed to the correct location in the SLC portion and not to a failed string in the MLC block.

Figure 19:
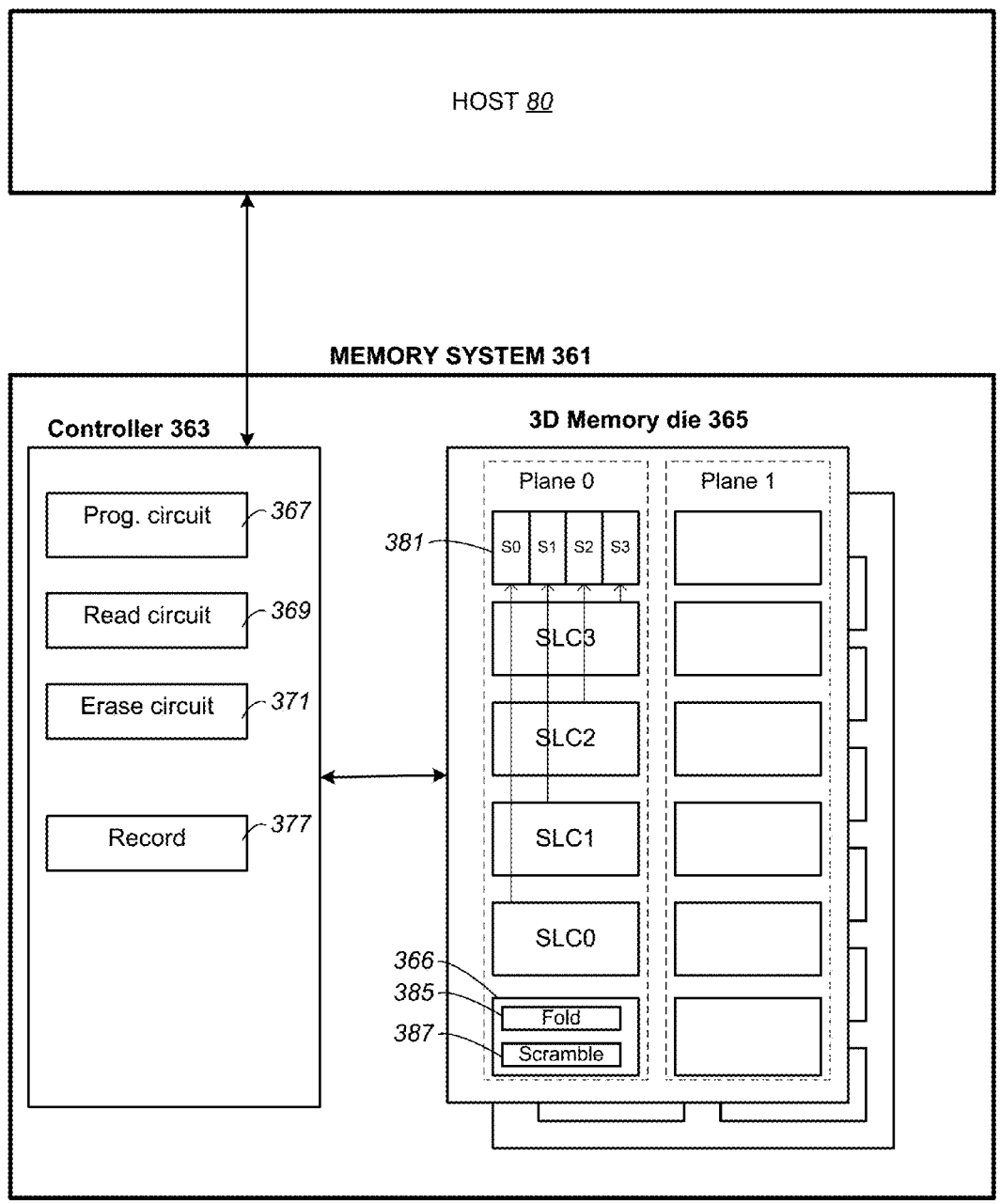
FIG. 19 illustrates an example of a memory system with data folding.

FIG. 19 illustrates an example of a memory system 361 in communication with a host 80. Memory system 361 includes a memory controller 363 and multiple three dimensional memory dies including three dimensional memory die 365. Three dimensional memory die 365 includes multiple individually-erasable blocks that are arranged in two planes, plane 0 and plane 1, each having a set of bit lines and control circuits (e.g. control circuit 366). In each plane, some blocks are operated as SLC blocks while others are operated as MLC blocks. For example, plane 0 includes SLC blocks (SLC 1-3) and an MLC block 381 that has four separately-selectable sets of NAND strings S0-S3. Folding is performed so that each fold-set is contained in one separately-selectable set of NAND strings in MLC block 381. In the example shown, fold-sets from SLC 0 are copied to string S0, fold-sets from SLC 1 are copied to string S1, fold-sets from SLC 2 are copied to string S2, and fold-sets from SLC 3 are copied to string S3. In other examples, fold-sets from different blocks may be copied to an individual set of strings in an MLC block. Folding circuit 385 may include latches so that data that is read out from the SLC portion of plane 0 (e.g. from one of SLC 0-3) is latched and subsequently written to MLC block 381 without being sent outside die 365 or plane 0. Scrambling circuit 387 performs scrambling of data that is read from the SLC portion prior to writing it to MLC block 381 and may perform descrambling of data from MLC block 381 using a pattern of scrambling keys that is repeated for every fold-set.

Memory controller 363 includes a programming circuit 367, read circuit 369, and erase circuit 371, which control program, read, and erase operations in memory dies (including die 365). Memory controller 363 also contains a record 377 that contains entries for fold-sets that fail to fold to an MLC block. Subsequently, read circuit 369 may direct read operations to an appropriate location in an SLC block when data of an unfolded fold-set is required. It will be understood that additional components that are not shown may be provided in both controller 363 and memory die 365. Components of controller 363 may be implemented as dedicated circuits in an application specific integrated circuit (ASIC), as programmable logic circuits (e.g. field programmable gate array, or FPGA), as logic circuits configured by software (e.g. firmware) for a specific function, or by some combination of these approaches.

Conclusion

The foregoing detailed description has been presented for purposes of illustration and description. It is not intended to be exhaustive or to limit the attached claims. Many modifications and variations are possible in light of the above teaching.

It is claimed:

1. A method of managing data in a three dimensional nonvolatile NAND memory comprising:
   copying first data of a first fold-set from a Single Level Cell (SLC) portion of the three dimensional nonvolatile NAND memory where the first data is stored in SLC format to a Multi Level Cell (MLC) block where the first data is stored in MLC format along two or more word lines in a first separately-selectable set of NAND strings of the MLC block, a fold-set being a minimum unit of data folding; and
   copying second data of a second fold-set from the SLC portion where the second data is stored in SLC format to the MLC block where the second data is stored in MLC format along two or more word lines in a second separately-selectable set of NAND strings of the MLC block.

2. The method of claim 1 further comprising scrambling the first and second data prior to storage in the MLC block, the fold-set being a minimum unit of data scrambling.

3. The method of claim 2 wherein data in the SLC portion is copied in fold-sets so that each fold-set is copied to an individual separately-selectable set of NAND strings of the MLC block and no fold-set extends across more than one separately-selectable set of NAND strings of the MLC block.

4. The method of claim 2 wherein the fold-set consists of eight logical pages of data, the first data consisting of data from eight sequential word lines of the SLC portion, the second data consisting of data from another eight sequential word lines of the SLC portion.

5. The method of claim 4 wherein the data of the fold-set is scrambled using a different offset scrambling key for each of the eight logical pages of data.

6. The method of claim 1 further comprising:
   copying third data from the SLC portion where the third data is stored in SLC format to the MLC block where the third data is stored in MLC format along two or more word lines in a third separately-selectable set of NAND strings of the MLC block; and
   copying fourth data from the SLC portion where the fourth data is stored in SLC format to an MLC block where the fourth data is stored in MLC format along two or more word lines in a fourth separately-selectable set of NAND strings of the MLC block.

7. The method of claim 1 wherein the MLC block consists of n separately-selectable sets of NAND strings, where n is greater than two, and wherein no two separately-selectable sets of NAND strings contain data copied from the same SLC block.

8. The method of claim 1 further comprising: identifying a separately-selectable set of NAND strings as defective, and subsequently storing no data in the separately-selectable set of NAND strings that is identified as defective.

9. The method of claim 1 wherein copying the first data to the MLC block is interleaved with copying the second data to the MLC block.

10. A system comprising:
a three-dimensional nonvolatile memory array that includes a plurality of Single Level Cell (SLC) blocks in an SLC portion where a memory cell stores one bit and a plurality of Multi Level Cell (MLC) blocks where a memory cell stores more than one bit; and
a data folding unit configured to copy a first fold-set from the SLC portion to a first separately-selectable set of NAND strings in an MLC block, and to copy a second fold-set from the SLC portion to a second separately-selectable set of NAND strings in the MLC block, the data folding unit configured to fold data in a minimum unit of a fold-set.

11. The system of claim 10 further comprising a data scrambling unit that scrambles data prior to storage in the MLC block, the data scrambling unit configured to scramble data in fold-sets, the fold-set being a minimum unit of data folding and scrambling.

12. The system of claim 10 wherein the MLC block contains n separately-selectable sets of NAND strings, the data folding unit configured to copy data from n SLC blocks to the n separately-selectable sets of NAND strings, data from an individual SLC block copied to an individual separately-selectable set of NAND strings.

13. The system of claim 10 wherein the data folding unit is configured to interleave copying of first data to the MLC block and copying of second data to the MLC block.

14. The system of claim 10 further comprising a bad string record that records locations of bad separately-selectable sets of NAND strings in the three dimensional nonvolatile memory array, the data folding unit configured to copy no data to any bad separately-selectable set of NAND strings.

15. The system of claim 14 further comprising a bad string identification unit that identifies separately-selectable sets of NAND strings that do not meet a predetermined standard.

16. A method of operating a three dimensional nonvolatile NAND memory comprising:
storing data in a plurality of Single Level Cell (SLC) blocks where the data is stored in SLC format; and
subsequently copying the data to a Multi Level Cell (MLC) block where the data is stored in MLC format, the data copied in a minimum unit of a fold-set, the MLC block including a plurality of separately-selectable sets of NAND strings, data of an individual fold-set copied exclusively to two or more word lines of an individual separately-selectable set of NAND strings in the MLC block.

17. The method of claim 16 wherein copying the data to the MLC block interleaves copying of data of a plurality of fold-sets.

18. The method of claim 16 further comprising scrambling the data prior to storage in the MLC block according to a scrambling scheme.

19. The method of claim 18 wherein the fold-set consists of data from X word lines in an individual SLC block and wherein the scrambling scheme applies a repetitive pattern that repeats every X word lines.

20. The method of claim 16 further comprising detecting a bad separately-selectable set of NAND strings in the MLC block and in response leaving data of corresponding fold-sets in the plurality of SLC blocks.

* * * * *